US005448239A

United States Patent [19]

Blumberg et al.

[11] Patent Number: 5,448,239

[45] Date of Patent: Sep. 5, 1995

[54] ANALOG-TO-DIGITAL CONVERTER

[75] Inventors: Leonid M. Blumberg, Hockessin, Del.; Joseph Bush, West Grove; Robert P. Rhodes, Lincoln University, both of Pa.

[73] Assignee: Hewlett-Packard Company, Palo Alto, Calif.

[21] Appl. No.: 202,311

[22] Filed: Feb. 25, 1994

[51] Int. Cl.[6] .......... H03M 1/50

[52] U.S. Cl. .......... 341/166; 341/156

[58] Field of Search .......... 341/128, 156, 166, 167

[56] References Cited

U.S. PATENT DOCUMENTS

| | | | |
|---|---|---|---|
| 3,566,265 | 2/1971 | Reid | 324/99 |
| 3,662,377 | 5/1972 | Dym et al. | 341/166 |
| 3,678,506 | 7/1972 | Wheable | 340/347 |
| 3,790,886 | 2/1974 | Kurtin et al. | 324/99 |
| 3,849,775 | 11/1974 | Buchanan et al. | 340/347 |
| 3,942,173 | 3/1976 | Wold | 340/347 |
| 4,063,236 | 12/1977 | Amemiya et al. | 340/347 |
| 4,074,257 | 2/1978 | Henry | 340/347 |
| 4,161,724 | 7/1979 | Smutny | 341/166 |
| 4,229,730 | 10/1980 | Huntington | 340/347 |
| 4,254,406 | 3/1981 | Meares | 340/347 |
| 4,357,600 | 11/1982 | Ressmeyer et al. | 340/347 |
| 4,568,913 | 2/1986 | Evans | 341/166 |
| 4,857,933 | 8/1989 | Knight | 341/168 |
| 4,965,578 | 10/1990 | Poujois | 341/156 |
| 5,101,206 | 3/1992 | Riedel | 341/156 |
| 5,117,227 | 5/1992 | Goeke | 341/166 |
| 5,194,868 | 3/1993 | Bahng et al. | 341/167 |

*Primary Examiner*—Marc S. Hoff
*Attorney, Agent, or Firm*—Richard F. Schuette

[57] ABSTRACT

Analog-to-Digital Converter (A/D converter) consisting of several continuously integrating charge balancing (CB) conversion stages. During each conversion interval, all CB capacitors are discharged by a reference current. In each stage, the end of the discharge of the CB capacitor is detected by a zero crossing detector. Time intervals between the zero crossing events and corresponding discharge termination events represent time equivalents of quantization errors. Each stage, other than the first, converts the time equivalents of quantization errors of the previous stage. Output of the entire multistage A/D converter is combined from the outputs of all stages in a way which provides compensation of a quantization error of any stage by the output of the next stage. Quantization noise (sequence of quantization errors) of the entire A/D converter becomes the same as the N-time differenced (N-number of stages) quantization noise of the last stage. The differencing shapes spectral density of quantization noise in such a way that the largest portion of the noise energy becomes shifted outside of the signal bandwidth. The larger the number of stages, the smaller the in-band portion of the quantization noise. The out-of-band portion of quantization noise can be filtered out in the post-conversion digital signal processing.

6 Claims, 4 Drawing Sheets

OUTPUT
FILTER
480
DIFFERENCER
457
459
419
469
487
FROM STAGE 3
START1
END1
STOP1
CONTROL LOGIC
413
COUNTER
417
418
START2
END2
STOP2
463
468
467
CLOCK
COMPAR-ATOR
412
462
OP AMP
411
461
415
465
START1/STOP1
START2/STOP2
414
464
416
458
466
E REF
END1/STOP1
INPUT
TO STAGE 3

ANALOG-TO-DIGITAL CONVERTER

BACKGROUND OF THE INVENTION

The disclosed invention relates generally to the digitization of unknown input signals such as voltage or current, and more particularly, to an improved method for multistage continuously integrating charge balancing analog-to-digital (A/D) conversion). An A/D converter can be viewed as consisting of two processes: sampling (conversion of continuous-time signals into sequences of samples) and quantization (conversion of continuously-valued signals or sequences into discretely-valued signals or sequences). Sampling is typically performed by sample-and-hold devices. Quantization is typically performed by quantizers. In some cases, such as continuously integrating charge balancing A/D conversion, sampling and quantization operations are implemented in the same stage.

The resolution or number of distinctive input levels which A/D conversion can represent by different output codes (digits), is limited by conversion errors. A sequence of conversion errors can be viewed as conversion noise. Both sampling and quantization cause conversion noise. Quantization noise is fundamental for an A/D converter as it comes from the very fact of representing continuously-valued signals by discrete levels. Sampling noise can result from switching and other errors. With the sampling performed by sample-and-hold devices, a significant portion of the signal energy can be lost and leads to a reduction in the signal-to-noise ratio and increase in significance of all conversion errors.

Multistage noise shaping conversion is an advanced technique for A/D conversion. Oversampling (sampling at a rate higher than the rate required by the signal bandwidth) in combination with noise shaping provides for shaping of the spectral characteristics of conversion noise in such a way that the major part of the noise energy is shifted outside of the signal bandwidth. In post-conversion digital signal processing, the out-of-band part of the conversion noise can be filtered out.

Most known structures for noise shaping conversion are only applicable to sample data sequences. Multistage noise shaping A/D conversion is generally only suitable for a single-bit conversion (sigma-delta modulation) and requires extremely high oversampling and high conversion rates relative to the signal bandwidth. These factors result in significant sampling noise and high design cost.

FIG. 1 illustrates a typical dual slope, single stage, continuously integrating charge balancing A/D converter. An operational amplifier 111 together with the charge balancing capacitor 115 and resistor 114 act as an integrator. The signal is connected to points 1 and 0. Before the start of the conversion cycle, capacitor 115 is positively charged by the input signal. The timing diagram in FIG. 2 illustrates the start of the conversion cycle at the time $T_{Start1}$. At that instant, Control Logic 113 generates a transition edge, Start1, synchronous with one of the edges of the high frequency Clock. The Start1 edge starts counter 117, and switches the switch 116 into position 1 starting the discharge of capacitor 115 through resistor 114. The discharge is driven by the difference between the reference voltage and input signal. The magnitude of discharge current in capacitor 115 due to the reference voltage is larger than the charge current due to the input signal. If the value of the reference voltage is more than twice as large as the largest allowable input signal, it takes less than a half of the conversion period to complete the discharge of capacitor 115. Control Logic 113 generates a transition edge End1 at the instant the voltage on capacitor 115 crosses the zero level and is detected by the zero crossing detector 112. A predetermined number of clock cycles later a stop edge, Stop1, is generated by the control logic 113. The stop edge is synchronous with the high frequency clock and stops the counter 117 and switches the switch 116 into position 0 to stop the discharge of capacitor 115. From the time $T_{STOP1}$ till the time $T_{START1}$ of the start of the next conversion cycle, the rate of charging of capacitor 115 is proportional only to the input signal.

A typical dual slope A/D converter stage is continuously integrating because the signal is never disconnected from the integrator's input. It is charge balancing since the length of the discharge of the charge balancing capacitor 115 in each conversion cycle tends to maintain the balance between the total charge on the capacitor due to the signal and the total discharge of it due to the reference voltage. The values of the resistor 114 and the charge balancing capacitor 115 can be selected in such a way that the discharge time for full scale signals lasts for many clock cycles resulting in the multibit A/D conversion. If the rate of the repetition of conversion cycles is much higher than the bandwidth of the input signal, the stage acts as an oversampling A/D converter. The process of discharging the charge balancing capacitor and counting the discharging time results in sampling and quantization.

The time interval between the zero crossing event End1, and the stop of the discharge event Stop1 is proportional to the error caused by the counter acting as a quantizer. The charge which is being quantized by counting clock cycles during the discharge of capacitor 115, is proportional to the integral of the input signal. The conversion error in the output data sequence 2 can be found as a difference of the sampling and quantization errors created during the two consecutive conversion cycles.

The conversion noise of the first stage is the sequence of differences of consecutive sampling and quantization errors. This noise is shaped such that the largest portion of the noise energy is shifted to higher frequencies outside of the bandwidth of the input signal whose energy is concentrated in the narrow vicinity of the relatively low frequencies. The out-of-band noise can be filtered out by post-conversion digital signal processing (DSP).

Charge balancing and the counting of clock cycles during the discharge interval replaces conversion of voltages by the more precise time counting and provides for further reduction in unpredictable quantization errors and further improvement in the signal-to-noise ratio. With substantial oversampling, the combination of all the aforementioned features allows nearly complete elimination of the in-band conversion errors by making the total conversion noise lower than analog noise of the front-end operational amplifier 111.

In spite of these advantages, a conventional single stage continuously integrating charge balancing A/D converter has a major drawback. In order to achieve a significant reduction in the conversion noise by the post-conversion DSP, a large oversampling is typically required. Such oversampling can be as large as the quantization noise reduction expected from the post-conversion DSP. Large oversampling (orders of magnitude) can require an equally large increase in the clock rate and substantial increase in the complexity of the design and its cost.

SUMMARY OF THE INVENTION

The invention provides for a method and apparatus for multistage continuously integrating charge balancing A/D converter. A plurality of multibit continuously integrating charge balancing A/D converter stages can be combined together such that each additional stage converts the error of the previous stage. An appropriate combination of the outputs of all stages significantly improves efficiency of the noise shaping compared to 1-stage conversion, and substantially reduces the requirement for oversampling.

The A/D converter contemplated by the invention has a first A/D converter with an input coupled to an analog input signal to continuously charge the A/D converter and a first switch for periodically coupling the A/D converter to a reference voltage to discharge the A/D converter. The discharge is terminated upon the zero crossing of the input signal. A second A/D converter is coupled to the first A/D converter through a switch which is actuated by the zero crossing of the input signal. A reference voltage is coupled to the input of the second A/D converter for a period of time corresponding to the error signal generated by the first A/D converter such that the error signal is quantized. A differencer in combination with a summing circuit is then employed for subtracting sequential error signals such that the digital output of the second A/D converter is subtracted from the digital output of the first A/D converter canceling out conversion error caused by the first stage A/D converter.

DESCRIPTION OF THE PREFERRED EMBODIMENT

Figure 1:
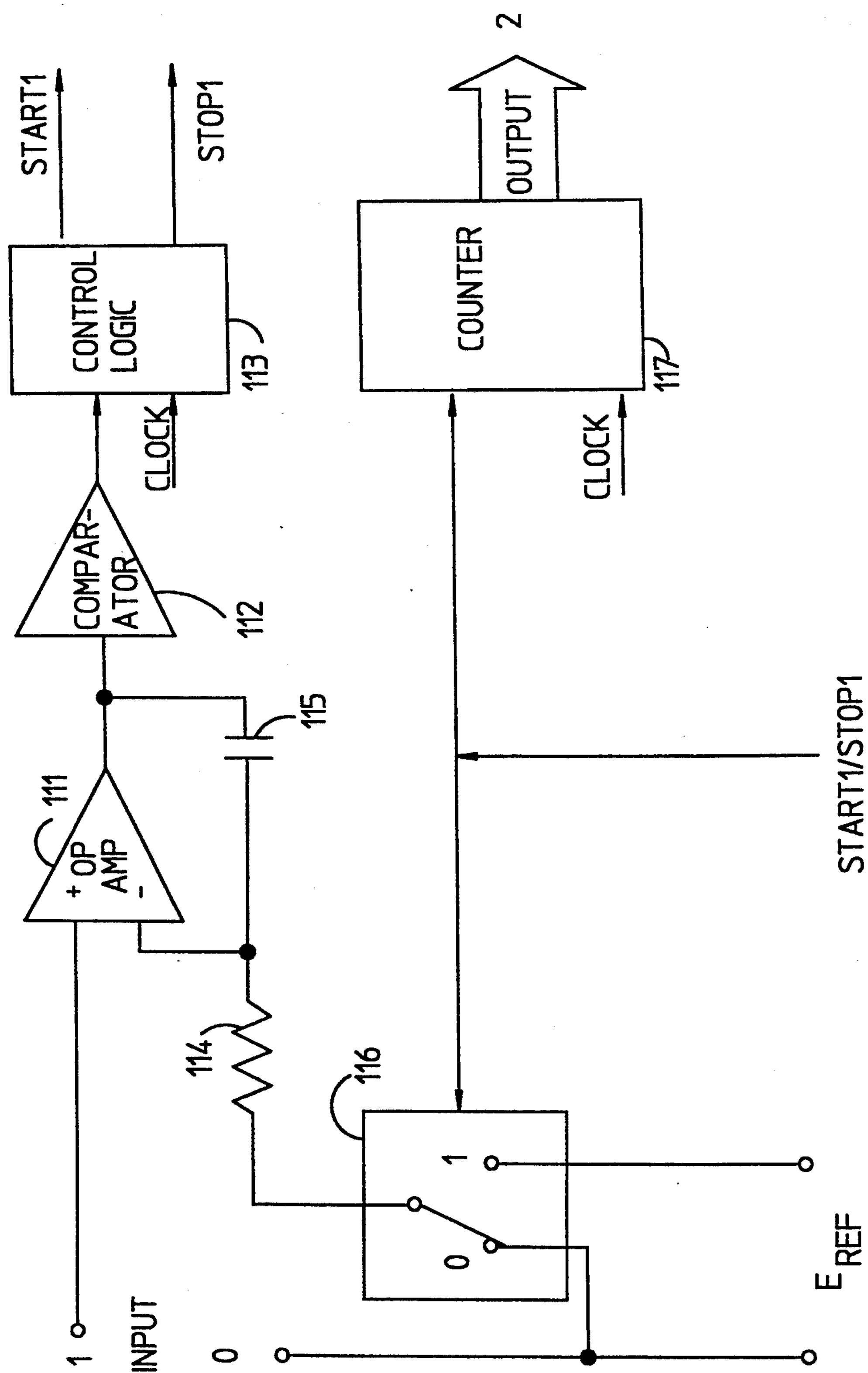
FIG. 1 is a circuit diagram of the prior art single stage multibit continuously integrating charge balancing A/D converter.
Figure 3:
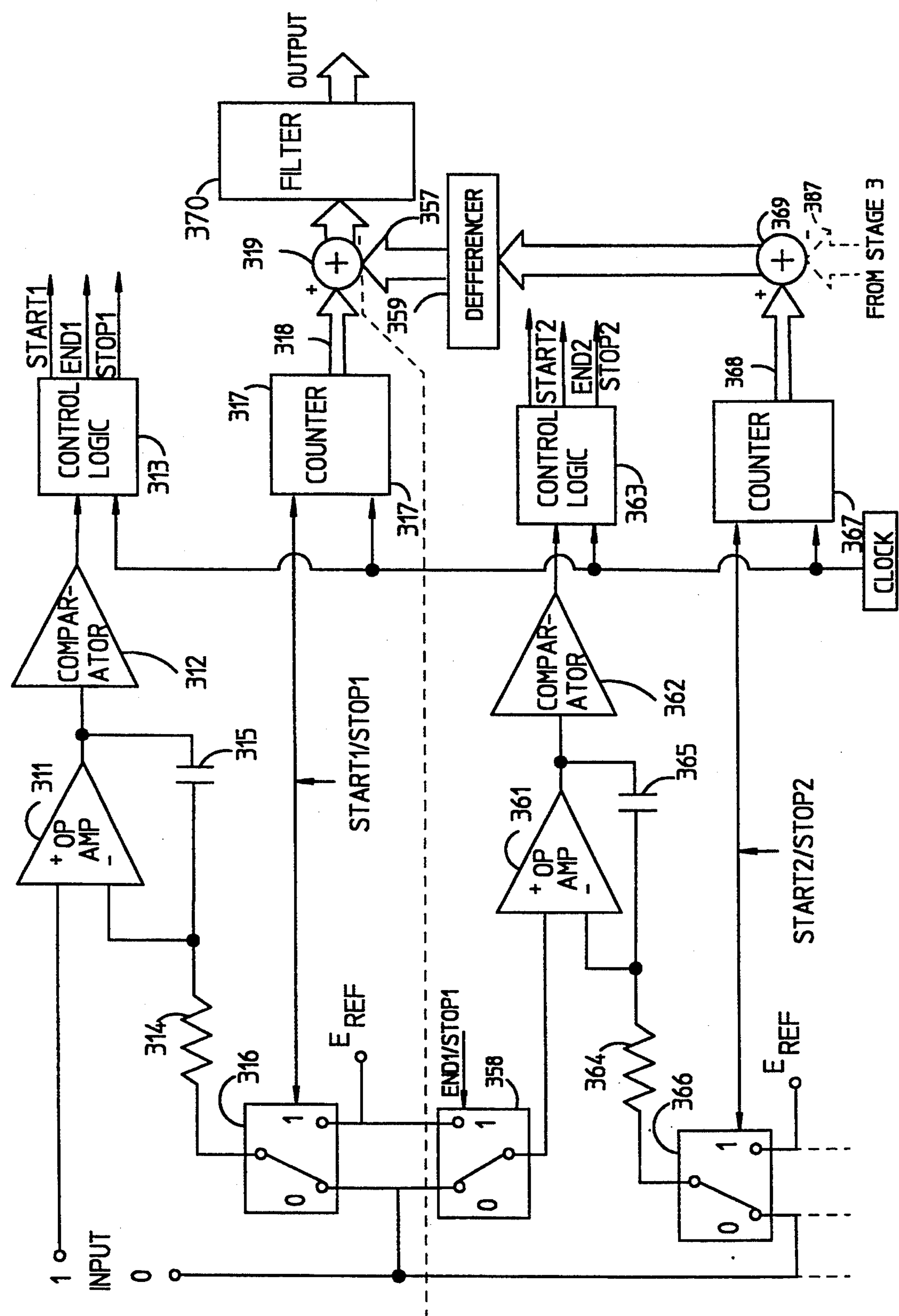
FIG. 3 is a circuit diagram of the preferred embodiment of the invention.

FIG. 3 illustrates a multistage, multibit continuously integrating charge balancing A/D converter. The second stage is structurally the same as the first stage shown in FIG. 1, and above the dashed line on FIG. 3. Each additional stage includes this same structure as well as the switch 358 for coupling the reference voltage to the input circuits of the second stage, and differencer 359 to perform an additional output operation before combining the output of the second stage with the output of the first stage.

In each conversion cycle, the charge accumulated on the charge balancing capacitor 315 between the time, $T_{End1}$, of the complete discharge of the capacitor and the time, $T_{Stop1}$, when the process of discharging actually stops is charge balancing error. This error directly relates to the conversion error in the first stage, and the sequence of the charge balancing errors directly relates to the conversion noise of the first stage. It can be shown that the conversion noise in the output 318 of the first stage is proportional to the stream of the differences between the charge balancing errors in a given conversion cycle and the conversion cycle immediately preceding it.

Figure 2:
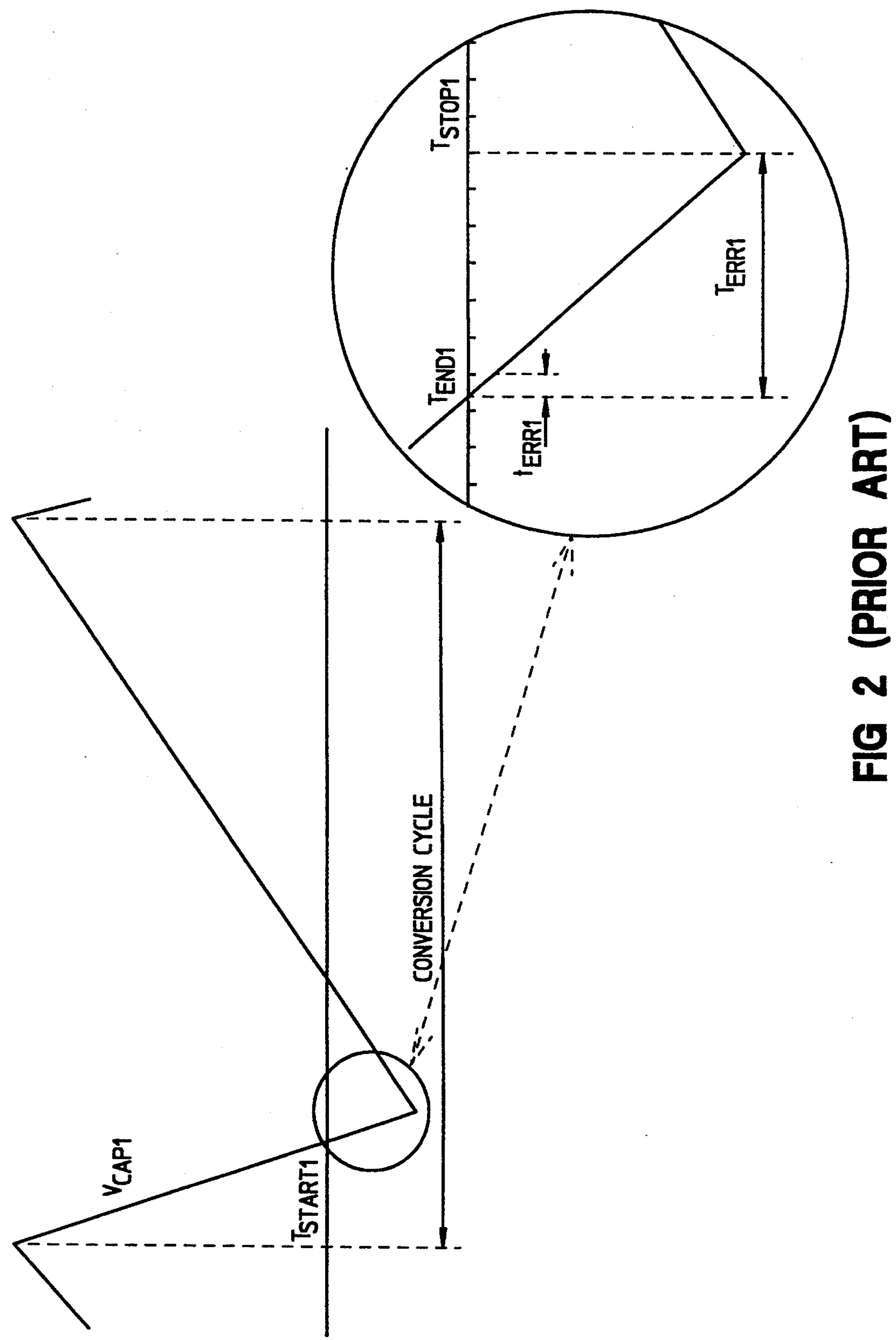
FIG. 2 is a graphical representation of the conversion cycle.

Each charge balancing error can be represented by the time interval $T_{err1}=T_{Stop1}-T_{End1}$ as set forth in FIG. 2. Therefore, the differenced stream of the time intervals $T_{err1}$ is proportional to the conversion noise in the first stage. The second stage measures $T_{err1}$ intervals of the first stage and subtracts their digital equivalents from the digital output 318 of the first stage. Thus, the conversion noise of the first stage is replaced with the differenced conversion noise of the second stage. That additional differencing by the differencer 359 further reduces the low frequency content of the conversion noise of the dual-stage quantizer, thus allowing for further net noise reduction after DSP of the output 2 by a filter 370. If further reduction of the low frequency content of the digitization noise in the output 2 is needed more stages can be added.

Switch 358 and the reference voltage form the input for the second stage. In each conversion cycle, switch 358 switches in the position 1 by the zero crossing event End1 in the first stage at the time $T_{End1}$. The event is generated in the Control Logic 313 of the first stage as a result of the zero crossing by the voltage on the capacitor 315. In position 1, the switch 358 connects the reference voltage to the input of the second stage integrator. The switch 358 remains in position I until the event Stop1 at the time $T_{Stop1}$ generated in control logic 313. Event Stop1 indicates termination of the discharge of the capacitor 315 and the end of counting of the Clock cycles in the Counter 317 in the first stage. It also switches the switch 358 back in the position 0 connecting the input of the second stage integrator to the zero-Volt rail. Therefore, the charge balancing capacitor 365 in the second stage is being charged only during the time interval $T_{err1}=T_{Stop1}-T_{End1}$. The input voltage applied to the second stage integrator during the time interval $T_{err1}$ is constant such that the charge accumulated on the capacitor 365 is proportional to $T_{err1}$. Therefore, the second stage digitizes the charge balancing errors associated with the first stage charge balancing capacitor 315. As described in the previous paragraph, the digital output 368 of the second stage differenced by the differencer 359 is subtracted from the digital output 318 from the first stage canceling out conversion error caused by the first stage.

One aspect of the measurement of conversion errors ($T_{err1}$) created in the first stage is important to emphasize. While only the unpredictable fractions ($t_{err1}$ as illustrated in FIG. 2), of the clock cycle contribute to the conversion errors in the first stage, the second stage actually measures much larger time intervals $T_{err1}$, which include the unpredictable parts, and the fixed number of the full clock cycles. In the differencer 359, the fixed parts cancel out, but they play an important initial role.

Time intervals $t_{err1}$ can be too small compared to the transition intervals in the switch 358 and other components in the second stage. Incomplete transition processes can cause significant sampling errors. Measurement of the larger time intervals instead of the shorter intervals allows for the completion of each transition regardless of the duration of the unpredictable part of the error. This causes the same sampling errors in each conversion cycle of the second stage. In the differencer 359, the constant sampling errors are canceled out.

Measurement of the longer time intervals instead of the shorter intervals also allows for the substantial increase in the charge in capacitor 365 and increase in its discharge time, thus making the second stage a multibit converter having the ability to cancel the additional conversion errors due to transitions in switch 366.

Figure 4:
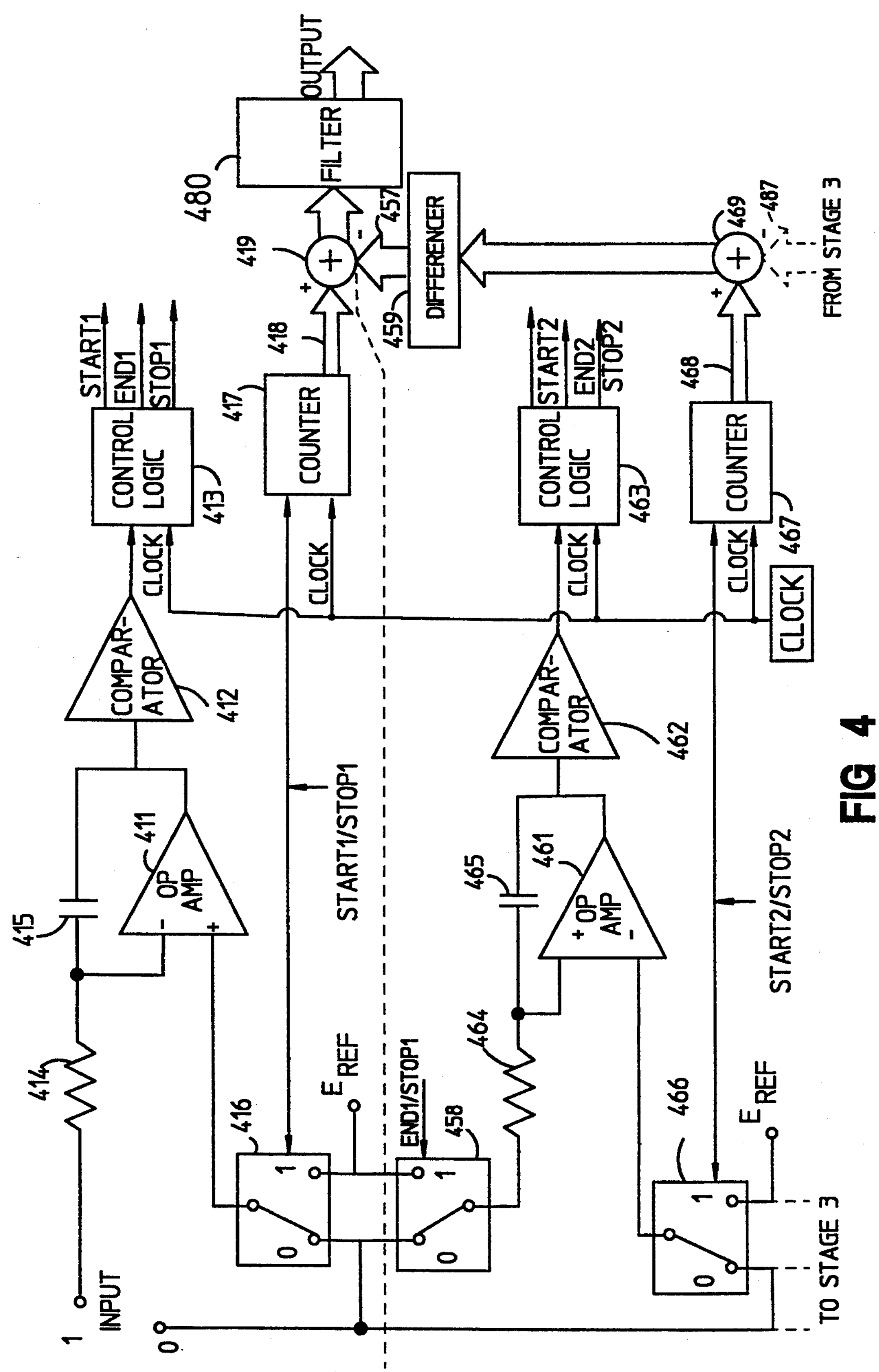
FIG. 4 is a circuit diagram of another embodiment of the invention.

FIG. 4 illustrates an alternative embodiment of the invention in which the input signal is coupled to the inverting input of the operational amplifier 411. All switching by the the control logic is the same as for the circuit in FIG. 3.

More stages can be added to the second stage as suggested at the bottom of FIGS. 3 and 4. Combination of several advantageous features into a single multibit, multistage, continuously integrating charge balancing A/D converter provides for the design of an inexpensive high resolution A/D converter whose conversion noise can be negligible compared to the analog noise of its front end circuits.

We claim:

1. A multistage continuously integrating charge balancing analog-to-digital (A/D) converter for converting an analog input signal during a series of periodic conversion cycles into a digital output signal, comprising:

- a reference voltage,
- a system clock for generating clock cycles,
- a first multi-bit, first order continuously integrating A/D converter having an integrating circuit further comprising a first capacitor that is continuously charged by the input signal,
- a first control logic circuit for generating a first start signal to periodically couple the reference voltage to the first capacitor to start each of a plurality of input signal conversion cycles, and for generating a first zero-crossing signal in accordance with the discharge of the first capacitor below the zero voltage level, and for generating a first stop signal after a predetermined whole number of clock cycles after the generation of the first zero-crossing signal, wherein the first stop signal stops each of the plurality of input signal conversion cycles and indicates that the reference voltage is no longer applied to the first capacitor,
- a first counter for counting the number of clock cycles between the first start signal and the first stop signal during each periodic conversion cycle, wherein the input signal is periodically quantized into a first series of digital outputs and a first series of conversion error signals, each conversion error signal representing the time interval between the first zero-crossing signal and the first stop signal for each periodic conversion cycle,
- a second multi-bit, first order continuously integrating A/D converter having an integrating circuit for periodically quantizing the first series of conversion error signals, the integrating circuit further comprising a second capacitor that is continuously charged by the reference voltage for the duration of each error signal such that a second series of charges proportional to the first series of error signals are accumulated during each periodic conversion cycle,
- a second control logic circuit for generating a second start signal to periodically couple the reference voltage to the second capacitor to start each of a plurality of conversion error signal cycles, and for generating a second zero-crossing signal each time the second capacitor is discharged below the zero voltage level, and for generating a second stop signal after a predetermined whole number of clock cycles after the generation of the second zero-crossing signal, the second stop signal indicating that the reference voltage is no longer applied to the second capacitor,
- a second counter for counting the number of clock cycles between the second start signal and the second stop signal during each periodic conversion error signal cycle, wherein the first series of error signals are periodically quantized into a second series of digital outputs,
- a differencer for subtracting consecutive digital outputs in the second series of digital outputs, the difference being a series of digital error signals in which the spectral density of the conversion noise of the first A/D converter is shifted outside of the bandwidth of the analog input signal,
- a summing circuit having a first input coupled to the output of the first A/D converter and a second input coupled to the output of the differencer, wherein for each conversion cycle, the second series of digital outputs are subtracted from the first series of digital outputs, such that the conversion noise of the first A/D converter is replaced with the differenced noise of the second A/D converter to provide the digital output signal corresponding to the analog input signal,
- a post-conversion filter for further noise reduction by removing an out-of-band portion of the conversion noise from the digital output signal.

2. The multistage continuously integrating analog-to-digital converter as claimed in claim 1, further comprising:

- a third multi-bit, first order continuously integrating analog to digital converter switchable connected to the second multi-bit, first order continuously integrating analog-to-digital converter, and having a third integrating circuit for quantizing a Second Series of error signals, each error signal in the second series representing the time period between the second zero-crossing signal and the second stop signal for each sequential error conversion cycle, the third integrating circuit further comprising a third capacitor that is continuously charged by the reference voltage during each error signal time period such that a series of charges proportional to the second series of error signals are added to the charge stored onto the third capacitor during each sequential conversion cycle wherein, third stage quantization errors are digitized into a third series of digital outputs,
- a second differencer for subtracting consecutive digital outputs in the third series of digital outputs, the difference being a second digital error signal in which the spectral density of the conversion noise is shifted further outside of the bandwidth of the analog input signal,
- a second summing circuit having a first input coupled to the output of the second A/D converter and a second input coupled to the second differencer, wherein for each conversion cycle, the digital output of the third A/D converter is subtracted from the digital output of the second A/D converter replacing the conversion noise of the second A/D converter with the differenced noise of the third A/D converter.

3. A multistage continuously integrating charge balancing analog-to-digital (A/D) converter for converting an analog input signal during a series of periodic conversion cycles into a series of digital outputs, comprising:

a system clock for generating clock signals, a rail voltage, a constant reference voltage ($E_{ref}$), a first multi-bit, first order continuously integrating A/D converter, the first A/D converter further comprising, a first operational amplifier having a non-inverting input continuously coupled to the input signal, an inverting input periodically coupled to the reference voltage, and an output, a first capacitor coupled between the amplifier output and the inverting input, the first capacitor being continuously charged by the input signal, a first control logic circuit for oversampling the input signal by periodically generating a first start signal to periodically couple the reference voltage to the first capacitor to start each of a plurality of input signal conversion cycles in which the first capacitor is periodically discharged by the reference voltage, a first comparator, coupled to the amplifier output, for generating a first zero crossing signal each time the first capacitor is discharged below the zero voltage level, wherein, the first logic circuit generates an first end signal in response to the zero crossing signal and a first stop signal after a predetermined whole number of clock cycles after the generation of the first end signal, thereby indicating that the reference voltage is no longer applied to the first capacitor, a first two position switch, actuated to a first position1 in response to the first start signal, wherein the reference voltage ($E_{ref}$) is coupled to the inverting input, and actuated to a second position in response to the first stop signal to couple the rail voltage to the inverting input, wherein, the first capacitor is charged by the input signal when the first switch is in the second position and discharged by the reference voltage ($E_{ref}$) when in the first position, a first counting circuit, actuated by the first start signal and the first stop signal, for counting the number of clock cycles between the first start signal and the first stop signal during each periodic conversion cycle, wherein, the input signal is periodically quantized into a first series of digital outputs, and a first series of error signals, each error signal defined as the time period between the first zero-crossing signal and the first stop signal for each periodic conversion cycle; and a second multi-bit, first order continuously integrating A/D converter having an analog input and a digital output, for generating a series of digital outputs corresponding to the series of conversion error signals generated by the first A/D converter during the first series of conversion cycles and accumulated by the second A/D converter, the second A/D converter further comprising, a second two position switch, actuated to a first position1 in response to the first end signal to connect the reference voltage ($E_{ref}$) to the non-inverting input of the second A/D converter, and actuated to second position in response to the first stop signal to connect the rail voltage to the non-inverting input of the second A/D converter, a second operational amplifier and a second capacitor which, for each conversion cycle, is continuously charged during the time interval corresponding to the error signal of the first A/D converter ($T_{err1}=T_{first\ stop}-T_{first\ end}$) by the reference voltage ($E_{ref}$) such that the charge accumulated on the second capacitor is proportional to the conversion error signal generated by the first A/D converter, a second control logic for over sampling the error signal by generating a second start, signal to periodically couple the reference voltage to the second capacitor to start each of a plurality of conversion error signal cycles, a second comparator coupled to the second integrating circuit for generating a second zero crossing signal each time the second capacitor is discharged below the zero voltage level, the second control logic further generating an Second end signal in response to the second zero crossing signal and a second stop signal after a predetermined whole number of clock cycles after the generation of the Second end signal, the second stop signal indicating that the reference voltage is no longer applied to the second capacitor, a third two position switch, actuated to a first position in response to the second start signal for coupling the reference voltage ($E_{ref}$)to the inverting input of the second operational amplifier, and actuated to a second position in response to the second stop signal for coupling the rail voltage to the inverting input of the second operational amplifier, a second counting circuit, actuated by the second start signal and the second stop signal, wherein, the series of conversion error signals ($T_{err1}$) are repetitively quantized into a second series of digital outputs by counting clock cycles between the second start signal and the second stop signal during each conversion error signal cycle, a differencer for subtracting consecutive digital outputs of the second series of digital outputs, the difference being a digital error signal in which the spectral density of the conversion noise is shifted outside of the bandwidth of the analog input signal, a summing circuit having a first input coupled to the output of the first counting circuit and a second input coupled to the differencer, wherein, for each conversion cycle, the digital output of the second counter is subtracted from the digital output of the first counter, replacing the conversion noise of the first A/D converter with the differenced conversion noise of the second A/D converter, and a post-conversion filter, wherein the out-of-band portion of the conversion noise is removed from the series of digital outputs.

4. A multistage continuously integrating analog-to-digital converter as claimed in claim 3, further comprising a third multi-bit, first order continuously integrating analog to digital converter switchable connected to the second multi-bit, first order continuously integrating analog-to-digital converter, and having a third integrating circuit for quantizing a second series of error signals, earth error signal in the second series defined as the time period between the second zero-crossing signal and the second stop signal for each sequential error conversion cycle, the third integrating circuit further comprising a third capacitor that is continuously charged by the reference voltage during each error signal time period such that a series of charges proportional to the second series of error signals are added to the charge stored onto the third capacitor during each sequential conversion cycle wherein, third stage quantization errors are digitized into a third series of digital outputs, a second differencer for subtracting consecutive digital outputs in the third series of digital outputs, the difference being a second digital error signal in which the spectral density of the conversion noise is shifted further outside of the bandwidth of the analog input signal, a second summing circuit having a first input coupled to the output of the second A/D converter and a second input coupled to the second differencer, wherein for each conversion cycle, the digital output of the third A/D converter is subtracted from the digital output of the second A/D converter replacing the conversion noise of the second A/D converter with the differenced noise of the third A/D converter.

5. A method of multistage continuously integrating analog-to-digital conversion of an analog input signal, comprising the method steps of:

continuously inputting the analog input signal into the first stage of a multistage, multi-bit first order continuously integrating analog-to-digital converter having an operational amplifier and a first capacitor, wherein the input signal continuously charges the first capacitor;

generating a first start signal to periodically couple the reference voltage to the first capacitor to start each of a plurality of input signal conversion cycles, generating a first zero-crossing signal each time the first capacitor is discharged below the zero voltage level, generating a first stop signal after a predetermined whole number of clock cycles after the generation of the first zero-crossing signal, to stop each of the plurality of input signal conversion cycles, wherein the first stop signal indicates that the reference voltage is no longer applied to the first capacitor, counting clock pulses during the discharge period between the first start signal and the first stop signal, the number of clock pulses being defined as a first binary output signal;

outputting a first error signal corresponding to the time between the first zero crossing signal and the first stop signal;

inputting the first error signal into the second stage of a continuously integrating analog-to-digital converter having a second operational amplifier and a second feedback capacitor, wherein the second feedback capacitor is charged by the reference voltage for a period corresponding to the first error signal;

periodically coupling the reference voltage to the second operational amplifier to discharge the second feedback capacitor;

counting clock pulses during the discharge period, the number of clock pulses being defined as a second binary error signal;

subtracting consecutive digital outputs in the second series of digital outputs, the difference being a second binary error signal in which the spectral density of the conversion noise of the first A/D converter is shifted outside of the bandwidth of the analog input signal, adding the second binary error signal to the first binary output signal, the sum being the digital output signal.

6. The method of multistage continuously integrating analog-to-digital conversion of an analog input signal claimed in method claim 5, further comprising the method steps of:

outputting a second error signal from a third stage corresponding to the quantization error noise accumulated on a second feedback capacitor between the time, $T_{End1}$, of the complete discharge of the capacitor and the time, $T_{Stop1}$, when the process of discharging actually stops;

inputting said second error signal into the third stage of a continuously integrating analog-to-digital converter having a third operational amplifier and a third feedback capacitor, wherein said second error signal charges said third feedback capacitor;

periodically coupling a reference voltage to said third operation amplifier to discharge said third feedback capacitor;

counting clock pulses during the discharge period, the number of clock pulses being defined as a third binary error signal; and adding said third binary error signal to said second binary error signal, the sum of which is then added to said first binary output signal, the sum being said digital output signal.

* * * * *